United States Patent [19]

Poponiak

[11] 3,929,529

[45] Dec. 30, 1975

[54] METHOD FOR GETTERING CONTAMINANTS IN MONOCRYSTALLINE SILICON

[75] Inventor: Michael R. Poponiak, Newburgh, N.Y.

[73] Assignee: International Business Machines Corporation, Armonk, N.Y.

[22] Filed: Dec. 9, 1974

[21] Appl. No.: 530,910

[52] U.S. Cl. .................. 148/191; 148/1.5; 148/187; 148/175; 204/32 S; 204/129.3; 204/143 GE; 156/17

[51] Int. Cl.[2] .................. H01L 7/52

[58] Field of Search ............ 148/191, 187, 1.5, 175; 204/143 GE, 32 S, 129.3; 156/17

[56] References Cited

UNITED STATES PATENTS

| | | | |
|---|---|---|---|
| 2,462,218 | 2/1949 | Olsen | 148/191 |
| 2,739,882 | 3/1956 | Ellis | 148/1.5 |
| 2,948,642 | 8/1960 | MacDonald | 148/1.5 |
| 3,529,347 | 9/1970 | Ingless et al. | 148/187 X |
| 3,579,815 | 5/1971 | Gentry | 148/175 X |
| 3,634,204 | 1/1972 | Dhaka et al. | 204/15 |
| 3,640,806 | 1/1970 | Watanabe et al. | 204/32 S X |
| 3,775,262 | 11/1973 | Heyerdahl | 204/15 |
| 3,874,936 | 4/1975 | d'Hervilly et al. | 148/1.5 |

OTHER PUBLICATIONS

Bogardus, "Gettering Technique and Structure," I.B.M. Technical Disclosure Bulletin, Vol. 16, No. 4, Sept. 1973, p. 1066.

Barson et al., "Gettering Technique," I.B.M. Technical Disclosure Bulletin, Vol. 15, No. 5, Nov. 1972, p. 1752.

Keenan et al., "Gettering Technique," I.B.M. Technical Disclosure Bulletin, Vol. 15, No. 6, Nov. 1972, p. 1755.

*Primary Examiner*—G. Ozaki
*Attorney, Agent, or Firm*—Wolmar J. Stoffel

[57] ABSTRACT

A method for removing fast diffusing metal contaminants from a monocrystalline silicon body by (1) anodizing at least one side of the body in an aqueous liquid bath under conditions that result in the formation of a porous silicon surface layer, (2) annealing the resultant structure in a non-oxidizing environment, and (3) exposing the body to an oxidizing environment to oxidize the porous silicon layer to $SiO_2$, or alternatively forming a capping layer over the porous silicon layer.

12 Claims, 9 Drawing Figures

METHOD FOR GETTERING CONTAMINANTS IN MONOCRYSTALLINE SILICON

BACKGROUND OF THE INVENTION

This invention relates to monocrystalline semi-conductor processing and, more particularly, to a method of gettering impurities from a semiconductor body. Semiconductor integrated circuit techniques and more particularly, silicon material and device technology have had a considerable amount of development during the past decade. Generally, the aim is to achieve unprecedented levels of integration, i.e., to obtain a density of about several thousand circuits per square millimeter on a semiconductor wafer. Acute problems have been detected in some steps of the manufacturing process in the masking and photolithography areas, but also unexpected difficulties have been encountered due to the material itself since its behavior in operation, due to minute quantities of contaminants, have not been completely mastered.

A better control of the quality of the semiconductor material, typically silicon, is needed. More particularly, the presence of micro-defects, such as precipitates, migration of impurities, crystallographic defects such as dislocations, and stacking faults, have had the dominating influence on yield, performance and reliability of semiconductor devices in high density applications. These micro-defects are well known from a theoretical point of view, and the related literature is quite abundant.

The presence of crystalline defects and metallic impurities in a semiconductor body can cause degradation of electrical characteristics as described by Goetzberger and Shockley in *Journal of Applied Physics*, 31, 10, page 1821 (1960); by Mets, *J. Electrochemical Society*, 112, 4, page 420 (1965); by Lawrence, *J. Electrochemical Society*, 112, 8, page 796 (1965); and by Poponiak, Keenan and Schwenker, Semiconductor Silicon 1973, page 701.

Contaminants, and in particular, fast diffusing metals such as Au, Cu, Fe and Ni present a very serious problem in integrated semiconductor devices, particularly high density applications. These contaminants degrade the electrical characteristics of the device in at least two ways. In growing monocrystalline silicon, there are inevitably many small defects in the crystal as it is grown, and/or dislocations produced in the devices as they are processed, as for example by diffusion, thermal gradients occurring during the epitaxial growth process, and atomic misfits. During fabrication of the devices, the contaminant metals gather in these dislocations and act as recombination centers. When these recombination centers occur in a depletion region of a device, the centers allow current to flow making the devices less effective. This condition is commonly referred to as a "soft junction." There are also crystalline imperfections that extend longitudinally in the crystalline lattice. These defects can be caused by a crystalline defect on the substrate wafer which propagates upwards into the epitaxial layer as it is grown. Metal contaminants during processing move about the body and settle or precipitate in these defects. In a transistor, if the fault or imperfection occurs between the emitter and the collector, a particularly troublesome condition exists. During the emitter diffusion, the dopant diffuses selectively in the fault. Additionally, the metal contaminants present in the body are also trapped in the fault.

The combination of the contaminant and the dopant provides a leakage path from the emitter to the collector producing a shorted or inoperative device. This phenomena is described in detail in *Journal of the Electrochemical Society*, Barson, Hess, Roy, Feb. 1969, Vol. 116, No. 2, pages 304–307.

Various gettering techniques are known in the art. In general, these techniques involve the concept of tying up or immobilizing the contaminants. It has been demonstrated that a high concentration diffusion on the back side of a wafer has a gettering effect. These dopants in the crystalline lattice in theory cause dislocations of the lattice. Contaminants are trapped by the dislocations. Further, there is a pairing attraction between the dopant and the contaminant. This process is described in IBM Technical Disclosure Bulletin, Vol. 15, No. 6, November 1972, page 1752 entitled "Gettering Technique." Another known technique is described in IBM Technical Disclosure Bulletin, Vol 12, No. 11, April 1970, page 1983 entitled "Gettering of Impurities from Semiconductor Materials" wherein the backside of a wafer is coated with a metal and the resultant device annealed. During the annealing period, the contaminant alloys with the metal thereby effectively tying or gettering them up. The metal is usually subsequently removed. It has also been observed that mechanical damage on the back side of the monocrystalline semiconductor wafer produced by lapping, polishing, or abrading has a gettering effect. Further, in commonly assigned application Ser. No. 373,202 filed June 25, 1973, now U.S. Pat. No. 3,874,936 and entitled "Method of Gettering Impurities in Semiconductor Devices Introducing Stress Centers and Devices Resulting Thereby" discloses a process wherein stress centers are formed in the non-active device regions of the device by introducing atoms into the device body having either undersized or oversized atomic radii compared to the whole semiconductor device material. The atoms can be introduced by either diffusion or ion bombardment.

The foregoing gettering techniques are generally operative but have drawbacks in various fabrication applications. Diffusing impurities into the back side or the front side of the device is a relatively expensive operation. Further, there is the danger of autodoping since the impurities will outdiffuse and be introduced into areas of the device where they are not desired. In general, the front and sides must be capped. The application of a metal coating on the back side of the wafer is not entirely satisfactory since it generally needs to be removed. During the annealing step, the metal may melt off the wafer presenting contamination problems to the apparatus. Damaging the back side of a semiconductor wafer is relatively expensive and presents the danger that the damage can be too extreme such that defects can be generated and extend through the wafer with subsequent processing. Further, the handling of the wafer could cause damage on the opposite device side.

SUMMARY OF THE INVENTION

Accordingly, it is the primary object of this invention to provide a means to improve semiconductor device quality be gettering detrimental contaminants contained in the bulk material.

It is another object of this invention to provide a gettering process fully compatible with all integrated circuit technology either bipolar or unipolar devices.

Another object of this invention is to provide a gettering process that can be performed at various stages in the fabrication of integrated circuit devices utilizing heating steps inherent in the process as an annealing step.

It is again another object of this invention to provide a gettering process that is inexpensive and dependable.

In accordance with the foregoing objects, the improved gettering method of the invention entails anodizing at least one side of a monocrystalline silicon semiconductor body in an aqueous liquid bath under conditions that result in the formation of a surface layer of porous silicon, annealing the resultant structure in a non-oxidizing environment for a time sufficient to trap the contaminants from within the semiconductor body into the porous silicon layer, and exposing the body to an oxidizing environment to oxidize the porous silicon layer to $SiO_2$. The $SiO_2$ layer can be removed thereby completely removing the contaminants from the wafer or can be retained on the device since the contaminants are effectively tied up in the layer. An alternate technique to oxidizing the porous silicon is forming a capping layer by pyrolytic deposition over the surface of the porous silicon. This forms a protective layer over the back side of the silicon wafer.

BRIEF DESCRIPTION OF THE DRAWINGS

The foregoing and other objects, features and advantages of the invention will be more apparent from the following more particular description of the preferred embodiments of the invention as illustrated in the accompanying drawing.

DESCRIPTION OF PREFERRED SPECIFIC EMBODIMENTS

Experimental evidence has indicated that contaminants in a monocrystalline semiconductor wafer are selectively held or trapped by the surface of the body. Experiments have indicated that after annealing a monocrystalline silicon wafer, the contaminants tend to accumulate at the surfaces resulting in a lower concentration of contaminants in the center portion of the body. This phenomena is described in an article by Larabee and Keenan in *Journal of the Electrochemical Society*, Vol. 118, No. 8, 1971, page 1353.

It is proposed that on damage-free silicon wafers, the high energy of the silicon surface is created by the unequal bonding and excessive dangling bonding sites which tend to attract metallic impurities. The basic concept involved in this method is to significantly increase the surface area of a semiconductor device thereby greatly enhancing the probability of tying up the contaminants during a subsequent annealing or process step wherein the device is heated. The surface area in a silicon wafer is materially increased by anodizing the selected surface in an aqueous HF solution under conditions that result in the formation of the porous layer of silicon.

Figure 1:
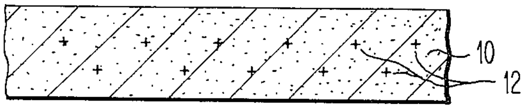
FIGS. 1–5 is a sequence of elevational views in broken section illustrating a first preferred specific embodiment of the method of the invention.
Figure 2:
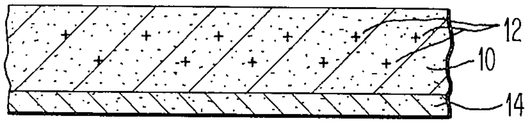
Figure 3:
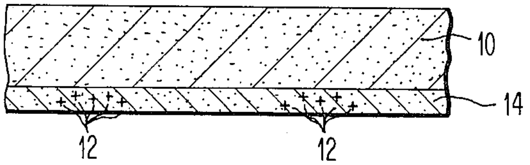

Referring now to FIGS. 1–5, FIG. 1 indicates a monocrystalline semiconductor wafer 10 which may or may not have an epitaxial layer on one surface, having a number of contaminants 12 within the crystalline lattice. Body 10 is then placed in an anodizing bath and anodized to form a layer 14 of porous silicon as shown in FIG. 2. The conditions of the anodizing bath are preferably adjusted to produce a porosity in layer 14 of approximately 56 percent. The technique for forming porous silicon by anodization is disclosed in U.S. Pat. No. 3,640,806, and also in commonly assigned U.S. Pat. application Ser. No. 479,321 filed June 14, 1974. Typically, a 56 percent porosity layer having a thickness of eight microns can be produced on a 2-ohm centimeter P-type wafer by immersing the wafer in a 25 percent HF aqueous solution, making the wafer the anode by connecting it to a positive voltage, immersing a platinum cathode and connecting it to the negative voltage, applying a voltage sufficient to generate a 5 milliamp per sq. centimeter current density for a time of 24 minutes. The aforementioned conditions are typical. The porosity varies with the current density, the substrate resistivity, the conductivity type, and the strength of the anodizing solution. Thus, the conditions must be adapted to the particular application, i.e., the silicon body in order to obtain the desired porosity. The porosity is desirably 56 percent in order that the stresses resulting in the subsequent step wherein it is oxidized is minimized or eliminated. A porosity greater than 56 percent is acceptable. As shown in FIG. 3, the body 10 is then annealed in a non-oxidizing atmosphere as for example nitrogen, argon or helium ambient. Typically, the anneal is done at 1000°C for an hour. Obviously, if the temperature is greater than 1000°C, the time can be reduced. Alternately, if the time is increased, the temperature can be reduced as low as 900°C. In general, as a guide, the anneal conditions should be at a temperature and a time sufficient to cause the movement of the contaminant under consideration to move at least the distance equal to the thickness of the wafer or more preferably twice the thickness of the silicon wafer. As indicated in FIG. 3, the contaminant atoms 12 are now illustrated as being trapped in porous silicon layer 14.

Figure 4:
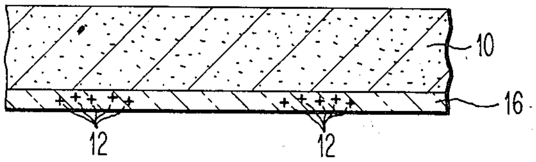

As indicated in FIG. 4, the porous silicon layer 14 is oxidized forming a layer 16 of $SiO_2$ on the body 10. Layer 14 can be oxidized in any suitable oxidizing atmosphere such as steam, $O_2$ or air an ambient. The oxidation of porous layer 14 results in more effective trapping of the contaminants in layer 14. The oxidation of layer 14 can typically be achieved by exposing the wafer for 15 minutes to a steam ambient at greater than 900°C, preferably at 1000°C.

Figure 5:
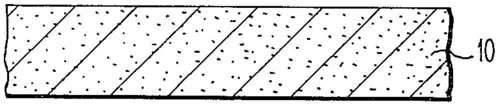

As shown in FIG. 5, the $SiO_2$ layer containing the contaminants can be removed by a simple HF etching treatment. Preferably, the HF solution will contain a chelating agent such as ethylenediaminetetraacetic acid which will assure that the contaminants in the dissolved $SiO_2$ film 16 will remain in solution rather than replate on the semiconductor wafer 10. Suitable chelating agents are described in "Chelating Agents and Metal Chelates" by Dwyer and Mellor, Academic Press, London 1965, page 292. Other suitable chelating agents for semiconductor processing are described by Kern in *RCA Review*, June 1970, page 207, and also by Rai-Chormbury and Schroder in *Journal of the Electrochemical Society*, Vol. 119, No. 11, 1972, page 1580.

An alternative technique in the aforedescribed process which involves an additional step is to diffuse a dopant for semiconductor materials into the porous layer 14 prior to the annealing step. The dopant is introduced into body 10 by the diffusion or implant at a concentration that is at or near the solid solubility limit of the impurity in the silicon. This produces dislocations in the body on the back side. Thus, during the anneal treatment, two conditions would be present to tie up the contaminants namely, a large amount of surface area, as well as dislocations in the back side surface of the body 10. Preferably, boron or phosphorus is diffused into the body 10 up to or exceeding the solid solubility limit at the diffusion temperature.

Another alternative to the process disclosed in FIGS. 1–5 is to substitute oxidation steps of the porous silicon layer 14, by a step which forms a capping layer over the surface of the layer 14. This could be achieved by a conventional pyrolytic deposition of $SiO_2$ or other impervious layer. As previously mentioned, the formation of a porous silicon layer 14 on the back surface of body 10 significantly increases the surface area of the body. Calculations indicate that there is an increase of 800 times the surface area when it is assumed that pores 400 Angstroms in diameter and 80000 Angstroms in height are formed in the layer 14.

Figure 6:
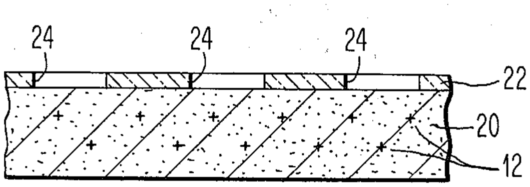
FIGS. 6–9 is a second sequence of elevational views in broken section illustrating a second preferred specific embodiment of the method of the invention.
Figure 7:
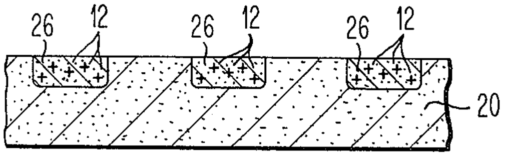
Figure 8:
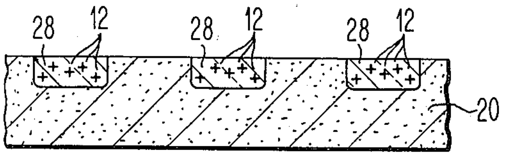
Figure 9:
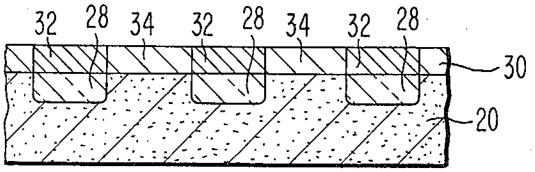

Referring now to FIGS. 6–9 there is disclosed yet another preferred specific embodiment of my invention. FIG. 6 illustrates a monocrystalline silicon semiconductor body 20 having therein contaminates 12. A masking layer 22 of $SiO_2$ or other suitable material is formed on the top surface of body 20 and openings made therein by conventional photolithographic and substractive etching techniques. Openings 24 are preferably in register with areas of the ultimate device which will contain the conductive lines. Porous silicon regions 26 are formed in the body 20, as shown in FIG. 7, by anodization as disclosed previously. If desired, the anodization can be preceded by a diffusion step wherein regions of low resistivity are formed by diffusing a P type impurity into the body 20. After the porous silicon regions 26 have been formed, the wafer is subjected to an annealing step disclosed previously. This results in the trapping of the contaminates 12 in the porous regions 26. As indicated in FIG. 8, the regions 26 are converted to $SiO_2$ regions 28 by exposure to an oxidizing environment. Subsequently, silicon layer 30 is grown on the surface of body 20 as shown in FIG. 9. This provides a substrate suited for fabricating integrated circuit devices therein. Regions 32 of layer 30 over $SiO_2$ regions 32 will be polycrystalline in nature. However, regions 34 overlying the monocrystalline areas, body 20 will be monocrystalline in nature and provide suitable regions for forming active and passive semiconductor elements therein. Regions 32 can be oxidized if desired to form relatively thick oxide regions that underly the metallurgy stripes and also surround the device regions for electrical isolation. This structure minimizes the capacitive effects of the metallurgy stripes.

While the invention has been described in detail with reference to specific embodiments thereof, it will be apparent to one skilled in the art that various changes and modifications can be made therein without departing from the spirit and scope thereof.

What is claimed is:

1. A method for removing fast diffusing metal contaminates from a monocrystalline silicon body comprising:

anodizing at least one side of said body in an aqueous liquid bath under conditions that result in the formation of a layer of porous silicon, annealing the resultant structure in a nonoxidizing environment at a temperature and a length of time sufficient to diffuse the contaminates of interest a distance at least the thickness of the body, and exposing the body to an oxidizing environment to oxidize said porous silicon layer to $SiO_2$.

2. The method of claim 1 wherein said layer of $SiO_2$ is removed by etching.

3. The method of claim 2 wherein the etching solution used to remove the $SiO_2$ includes a chelating agent.

4. The method of claim 2 which further includes the step of diffusing an impurity into and through said porous silicon layer before annealing.

5. The method of claim 4 wherein said impurity is diffused into said body at a concentration that equals or exceeds the solid solubility limit of the impurity in silicon.

6. The method of claim 5 wherein said impurity is boron.

7. The method of claim 5 wherein said impurity is phosphorus.

8. The method of claim 1 wherein the non-oxidizing environment is argon.

9. The method of claim 1 wherein said annealing is performed at a temperature of at least 1000°C.

10. The method of claim 1 wherein P type diffused regions are formed in said body.

11. The method of claim 10 wherein an epitaxial layer is deposited on the top surface of said body over the monocrystalline areas.

12. The method of claim 1 wherein said oxidizing environment is a steam ambient at a temperature greater than 900°C.

* * * * *